US007005945B2

(12) United States Patent
Lanz et al.

(10) Patent No.: US 7,005,945 B2
(45) Date of Patent: Feb. 28, 2006

(54) TAMPER RESISTANT FILTER TRAP

(75) Inventors: Charles N. Lanz, Oneida, NY (US); Eric J. Purdy, Constantia, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 40 days.

(21) Appl. No.: 10/865,118

(22) Filed: Jun. 10, 2004

(65) Prior Publication Data

US 2005/0275484 A1 Dec. 15, 2005

(51) Int. Cl.
*H03H 7/01* (2006.01)

(52) U.S. Cl. ....................................... 333/185; 333/176

(58) Field of Classification Search .................. 333/12, 333/176, 182, 183, 185; 439/607, 620, 638, 439/911
See application file for complete search history.

(56) References Cited

U.S. PATENT DOCUMENTS

| | | | | |
|---|---|---|---|---|
| 5,278,525 | A | 1/1994 | Palinkas | |
| 5,632,651 | A | 5/1997 | Szegda | |
| 6,529,103 | B1 * | 3/2003 | Brendel et al. | 333/182 |
| 6,759,927 | B1 * | 7/2004 | Maguire et al. | 333/185 |

* cited by examiner

*Primary Examiner*—Seungsook Ham
(74) *Attorney, Agent, or Firm*—Wall Marjama & Bilinski LLP

(57) ABSTRACT

Method and apparatus for protecting a filter trap that is utilized in a coaxial cable system against theft of service. A shield is mounted inside the filter trap which contains a pair of end connectors that are aligned along a common axis. The shield has two parallel end faces that are perpendicularly aligned with regard to the common axis. A barrier is mounted on one or both end faces for intercepting a cutting tool moving along the axis to direct the tool away from the axis causing the tool to break or to prevent a passage to be completed between the end connectors.

27 Claims, 4 Drawing Sheets

TAMPER RESISTANT FILTER TRAP

FIELD OF THE INVENTION

This invention relates to a filter trap suitable for use in a cable system and, in particular, to apparatus for preventing the theft of service from a cable system having filter traps for preventing specific data carrying frequencies from reaching a subscribers location in a usable form.

BACKGROUND OF THE INVENTION

An improved filter trap for use in a cable system is disclosed in U.S. Pat. No. 5,278,525 to Palinkas, the disclosure of which is incorporated herein by reference. The Palinkas device is illustrated in FIG. 1 and is generally referenced 10. The device includes a pair of housings 12 and 13 each of which contains filter components for removing or attenuating signals at selected frequencies so that the selected signals will not reach a subscribers location in a usable form. The housings are coaxially aligned along a common center axis 15 with the adjacent end walls 17 and 18 of the housings being mounted in close proximity. To one another an electrical isolation shield 20 is mounted between the housings to maintain separation between the two and to prevent flux generated by the filters from crossing over between the housings. The isolation shield is a disc shaped member having opposed end faces that are perpendicularly aligned with reference to the common axis 15. A pair of off axis keys 21—21 are carried upon each end face of the shield which mate with complementary keyways 22—22 formed in the adjacent end walls of the two housings. The two filter housings and the isolation shield are, in assembly, contained within a tubular sleeve 25 and suitable gaskets 26 and 27 are provided at the two ends of the sleeve to prevent moisture and other contaminants from passing between the sleeve and the housings.

A cut out 29 is provided in the shield which permits an off axis electrical lead 30 to pass between the housings. Housing 12 is equipped with an end cap 31 having a female threaded connector 33 containing a terminal pin 35 that enables the housing to be coupled to a coaxial cable. The second housing 13 contains an end cap 36 having a male threaded connector 37 which contains a connector terminal (not shown) for coupling the housing to the second coaxial cable.

Theft of service has long been a problem in the cable industry. Most distribution boxes or taps servicing most cable systems are readily accessible to the general public. All the signals provided by the network are carried to the tap on the providers cable. However, only the signals that are paid for by a subscriber are tapped onto the subscribers cable, the remaining signal being blocked or attenuated by filter traps that are located in the distribution box.

If a subscriber wishes to gain illegal access to the blocked or attenuated signals, he or she can simply remove the blocking or attenuating filters and connect the subscribers cable directly to the tap input. This type of tampering with the tap connection is, however, easily detected by a visual inspection of the distribution box.

It has been found, however, that the prior art filter assembly described in the above noted Palinkas patent can be circumvented in manner that is not easily detected by a visual inspection. This is achieved by removing the filter housing from the tap and drilling or otherwise creating a passage running along the commonly shaped axis between the two end connectors of the assembly. The center connectors of a coaxial cable can then be passed through the passage between the connectors to bypass the filters. The assembly, so altered, is then reinstalled in the distribution box in its original location. A service person inspecting the system can see the filter assembly is in place and without further inspection, it is assumed it is working properly to block or attenuate signal at the tuned frequencies.

SUMMARY OF THE INVENTION

It is a primary object of the present invention to improve cable systems.

It is a further object of the present invention to prevent the theft of service of a cable system.

A still further object of the present invention to prevent alteration of a cable system filter trap is such a manner that the filter will pass a visual inspection.

Another object of the present invention is to impede the ability to create an internal passage running between the end connectors of a filter trap so that thus preventing a shut from being installed between the input and output connectors of the trap which would defeat the filter network.

These and other objects of the invention are attained by method and apparatus for protecting a cable system against theft of service. In one embodiment of the invention, a filter assembly containing a pair of filter housings are mounted in back to back alignment along a common axis. A first cable connector is mounted at one end of the assembly and a second cable connector is mounted at the other end of the assembly with both connectors being coaxially aligned along the common axis. A shield having two opposed parallel end faces is mounted between the two filter housings with the end faces being perpendicularly aligned with respect to the common axis. A barrier is mounted upon the shield that has a surface that is arranged to intercept a cutting tool, such as a drill bit, that is moving along the common axis to prevent the tool from reaching the other connector.

In another embodiment of the invention the shield is mounted inside of a single filter housing between a pair of end connectors that share a common axis. Here again the shield has flat end faces that are perpendicular to the common axis. A barrier is mounted upon one or both of the faces so as to intercept a cutting tool that is moving along the common axis and direct the tool away from the axis to either break the tool or divert the tool along a path of travel such that a passage is not established between the connectors.

BRIEF DESCRIPTION OF THE DRAWINGS

For a better understanding of these and objects of the invention, reference will be made to the following detailed description of the invention which is to be read in associatiion with the accompanying drawing, wherein.

DESCRIPTION OF THE INVENTION

Figure 1:
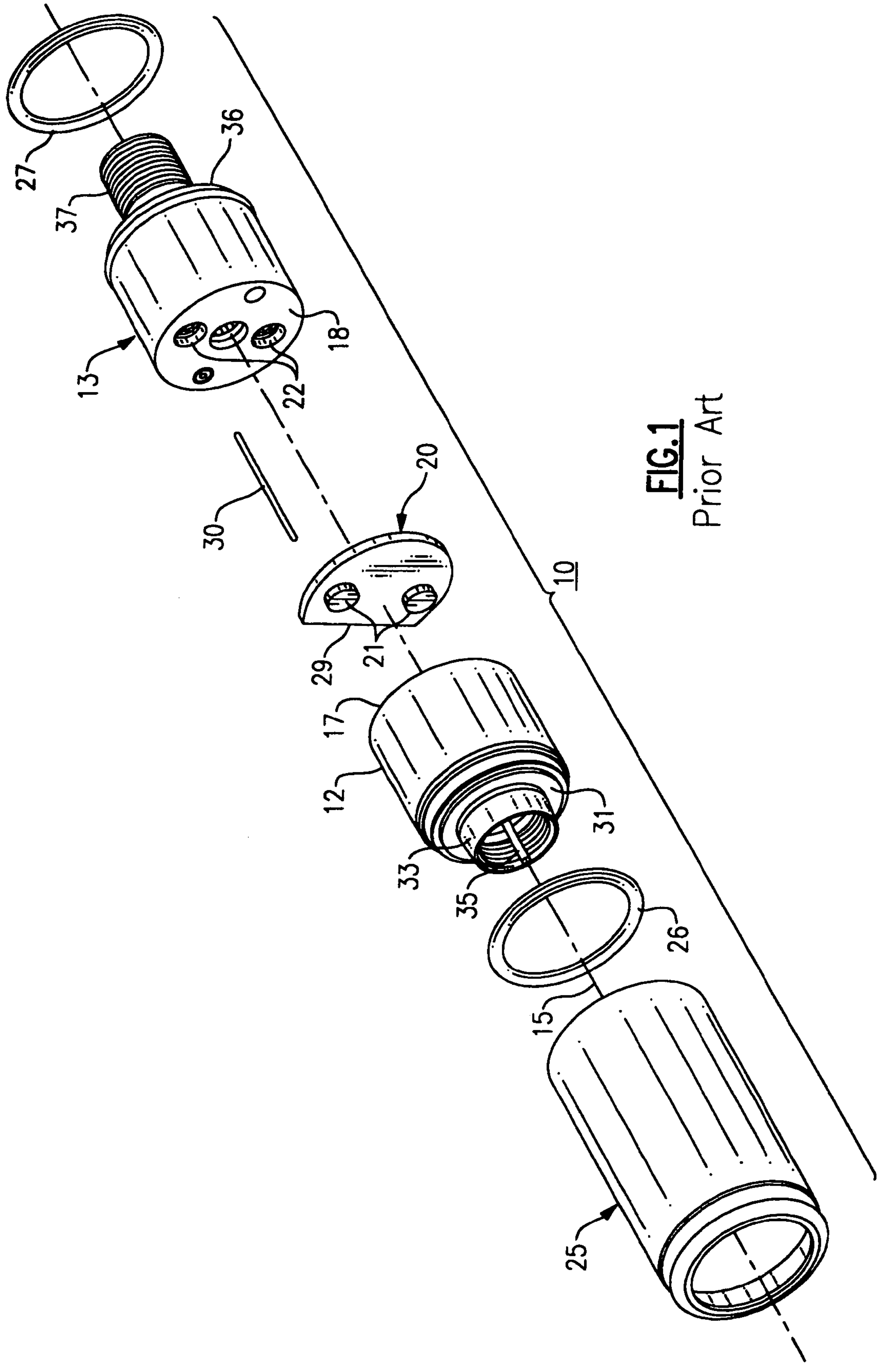
FIG.1 Prior Art
FIG. 1 is an exploded view in perspective showing a prior art filter trap assembly that contains a pair of back to back filter housing that share a common axis.
Figures 2, 3, 4:
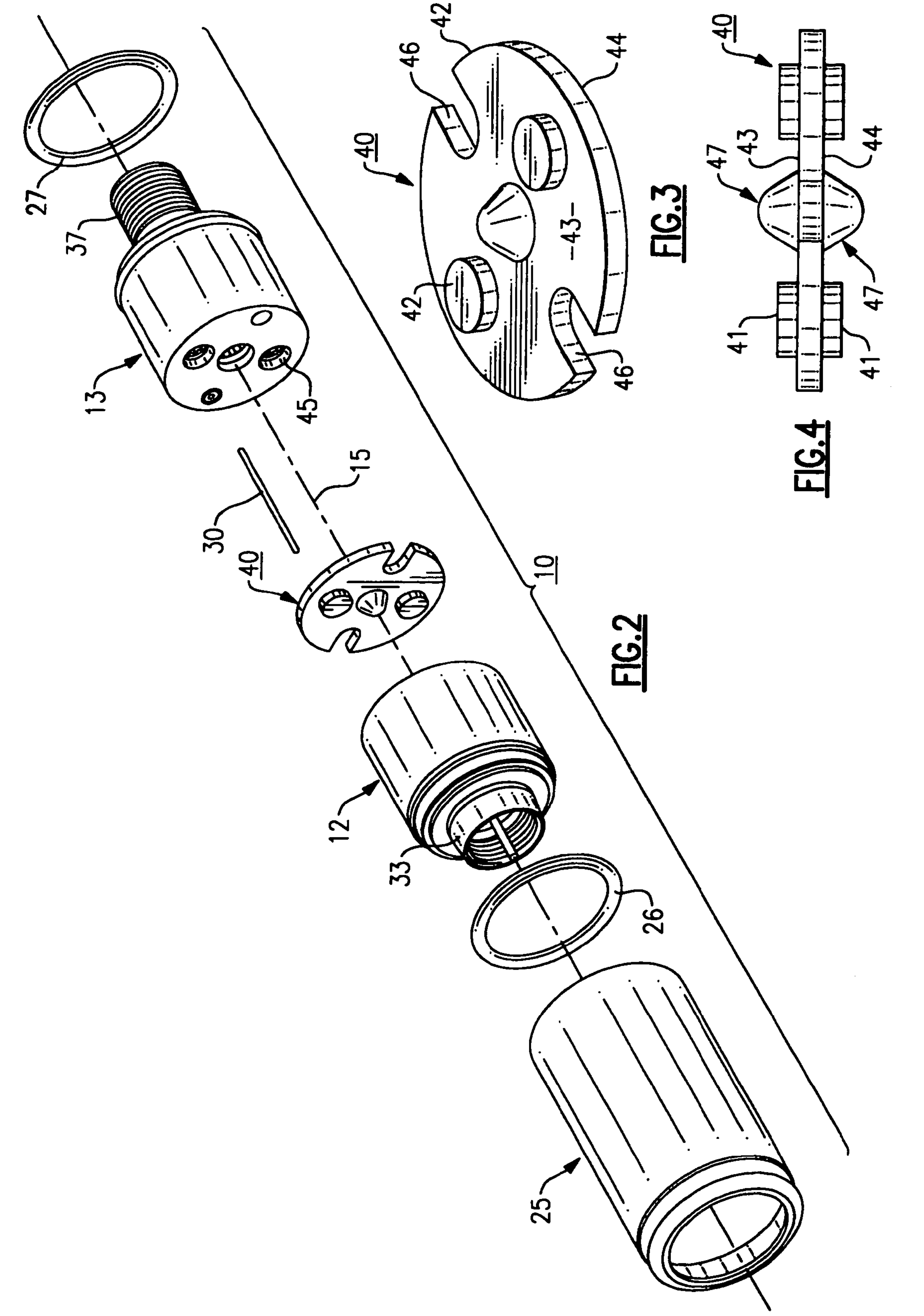
FIG. 2 is an exploded view in perspective illustrates a filter trap assembly similar to that shown in FIG. 1 which embodies the teachings of the present invention.
FIG. 3 is an enlarged perspective view of a shield suitable for use in the present invention.
FIG. 4 is a side elevation of the shield illustrated in FIG. 3.

Turning now to FIG. 2, there is illustrated a filter trap assembly of the type disclosed in the previously mentioned Palinkas patent and shown in FIG. 1 wherein like elements described in reference to FIG. 1 are identified with like numerals in FIG. 2. Here again a pair of filter housings 12 and 13 are coaxially aligned along a common axis 15 and are mounted in a back to back relationship with a sleeve 25. An electrical isolation shield 40 is positioned between the two filter housing which has been modified to prevent a cutting tool, such as a drill bit or a reamer, from creating an internal passage along the common axis between the two end connectors 33 and 37 through which a shunt can be passed to establish a direct connection between the network input to the tap and a subscribers cable thus circumventing the filter network.

The modified isolation shield 40 is shown in further detail in FIGS. 3 and 4. The shield includes a circular disc 41 that conforms to internal contour of sleeve 15. The disc is fabricated of an electrical insulating material that will prevent flux generated in one of the housings from passing over into the adjacent housing and thus degrading the effective functioning of the filter trap. Circular keys 42—42 are mounted on the opposed end faces 43 and 44 of the shield which are arranged to mate with suitable keyways 45 formed in the adjacent end walls of the two housings. Cutouts 46 are also provided in the shield to allow an electrical lead 30 to pass between the two housings.

In this embodiment of the invention, a barrier generally referenced 47 is centrally mounted on either end face of the disc. The barrier has convex shaped dome profile with the apex of the dome being centered upon the common axis 15 of the filter in assembly. Preferably, the barrier is formed of a hardened material that will resist penetration by a cutting tool such as a drill bit. A tool that is along the common axis through one of the connectors will thus be intercepted by the dome and directed away from the common axis. Because of the relatively small size of the connector opening found in most filter traps, a tool, such as a drill, that is passed into the filter trap through the connector opening will start to bend when it is diverted away from the common axis by the barrier. Due to the contour of the dome, the drill will either break eventually or be diverted sufficiently so that a passage will not be completed between the end connectors.

Figure 5:
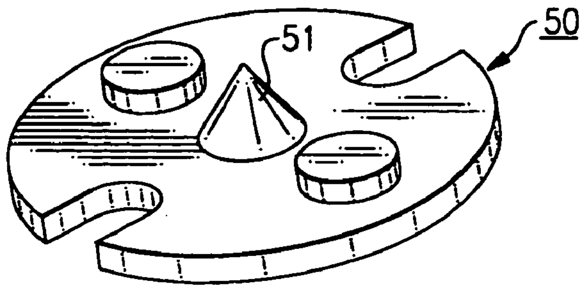
FIG. 5 is a perspective view of a second embodiment of a shield suitable for use in the practice of the present invention.
Figure 6:
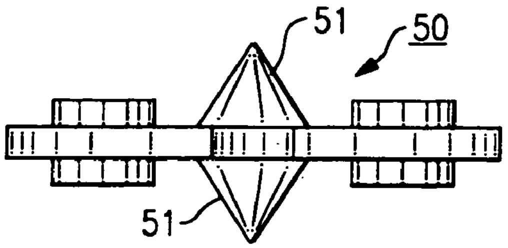
FIG. 6 is a side elevation of the shield illustrated in FIG. 5.

FIGS. 5 and 6 illustrate a further embodiment of the invention in which an insulation shield referenced 50 of the general configuration described above is equipped with a conical shaped barriers 51. Here again, the apex to the cone is centered upon the common axis of the filter in assembly. The barrier is fabricated of a hardened material so that a cutting tool that is intercepted by the cone will be turned away from the common axis at an angle to induce breakage of the tool or precluding a passage from being completed between the end connectors.

Figure 7:
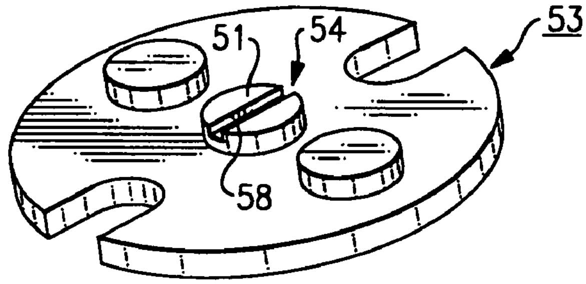
FIG. 7 is a perspective view showing a third shield suitable for use in the practice of the present invention.
Figure 8:
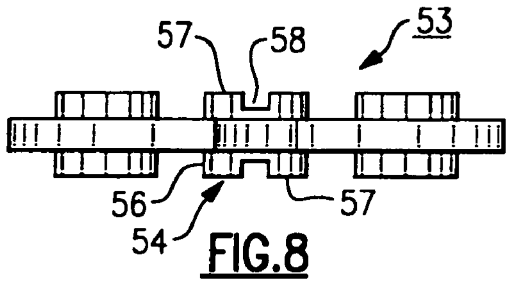
FIG. 8 is a side elevation of the shield illustrated in FIG. 6.

A still further embodiment of the invention is illustrated in FIGS. 7 and 8. In this embodiment the shield 53 contains a barrier 54 having a cylindrical body 56. The body, in turn, has a flat top surface 57 having a channel 58 extending across the top surface of the barrier. The body of the barrier is center upon the common axis 15 of the filter so that the channel cuts across the axis. The channel is profiled to capture a cutting just the tip of a cutting tool such as a drill bit. Once captured, the rotation of the bit will cause the bit to walk along the channel away from the common axis again inducing tool breakage or preventing a passage between the end connectors from being completed.

Figure 9:
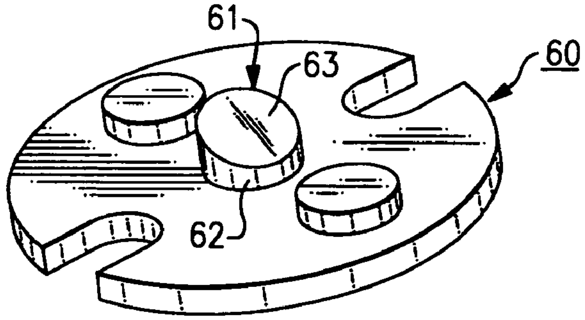
FIG. 9 is a perspective view further illustrating a forth shield suitable for use in the practice of the present invention.
Figure 10:
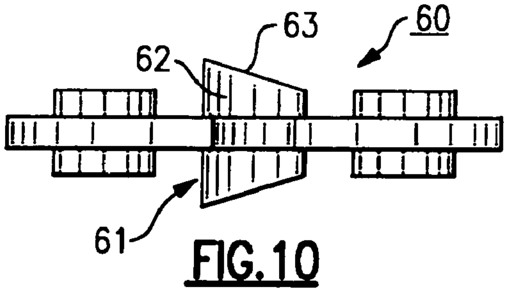
FIG. 10 is a side elevation of the shield illustrated in FIG. 8.

Yet another embodiment of the invention is illustrated in FIGS. 9 and 10 wherein the isolation shield 60 contains a barrier 61 centered on each of its end faces. The barrier includes a cylindrical body 62 that contains an inclined flat top surface 63 that passes through the common axis 15 of the filter in assembly. The inclined surface is hardened so that a cutting tool, such as a drill bit, moving along the common axis will be intercepted by the surface and directed away from the common axis to induce tool breakage or prevent a passage from being formed between the end connectors of the filter assembly.

Figure 11:
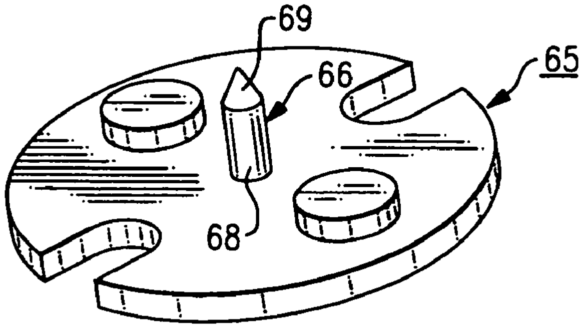
FIG. 11 is a perspective view showing a further embodiment of a fifth shield suitable for use in the practice of the present invention.
Figure 12:
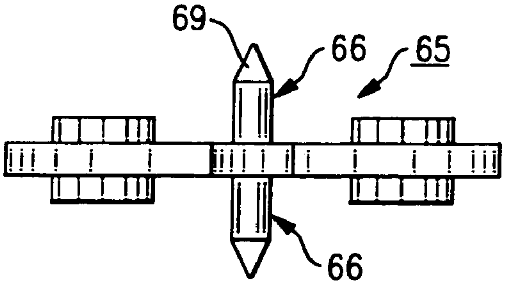
FIG. 12 is a side elevation of the shield illustrated in FIG. 11.

A further embodiment of the invention is illustrated in FIGS. 11 and 12. The isolation shield 65 in this case contains a barrier 66 centered on either side of the shield. The barrier includes a hardened steel rod 68 that terminates in a relatively sharp point 69. The tip of the point, in assembly is centered upon the common axis of the filter and will thus intercept a cutting tool moving along the axis and direct the tool away from the axis at an angle to induce tool breakage or to prevent a passage from being created between the connectors.

Figure 13:
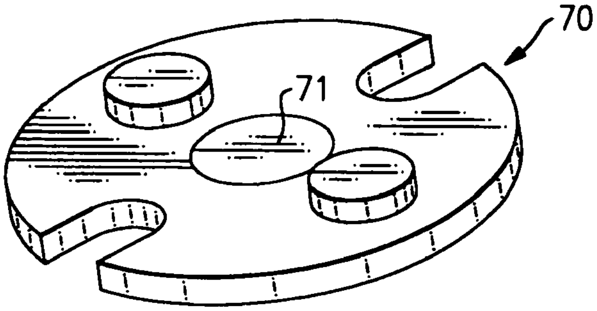
FIG. 13 is a perspective view showing a sixth shield embodiment.
Figure 14:
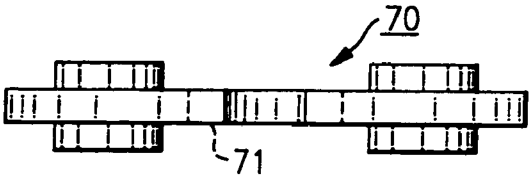
FIG. 14 is a side elevation of the shield shown in FIG. 13.

FIGS. 13 and 14 illustrate yet another embodiment of the invention wherein the shield 70 contains a harden disc 71 which in assembly is centered upon the common axis 15 of the filter assembly. The hardened disc may be integral with the shield or may be secured to the shield by any suitable means. The disc has a hardness such that it will resist penetration of the drill bit.

Figure 15:
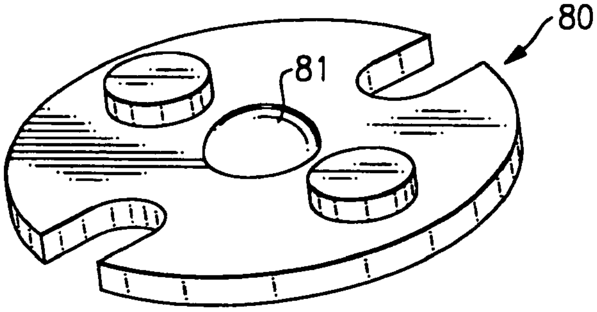
FIG. 15 is a perspective view showing a further embodiment of the invention.
Figure 16:
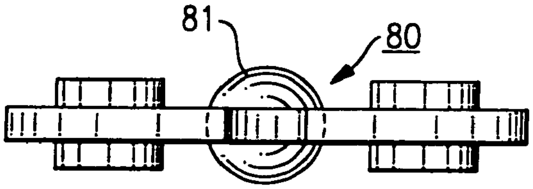
FIG. 16 is a side elevation of the shield shown in FIG. 15.
Figure 5:
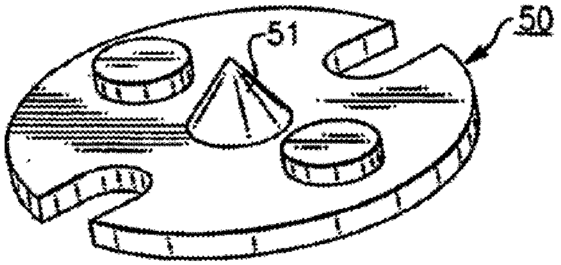
Figure 6:
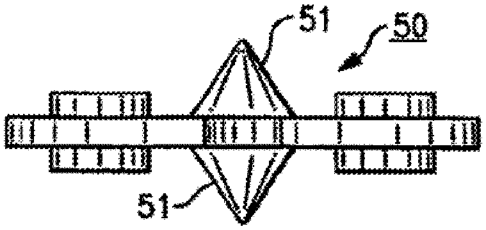
Figure 7:
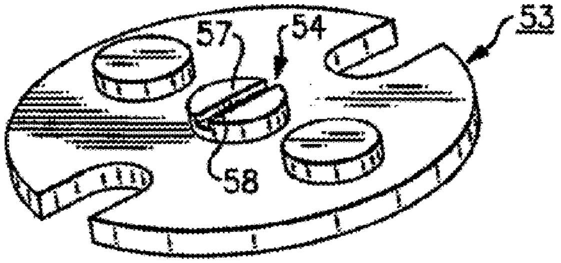
Figure 8:
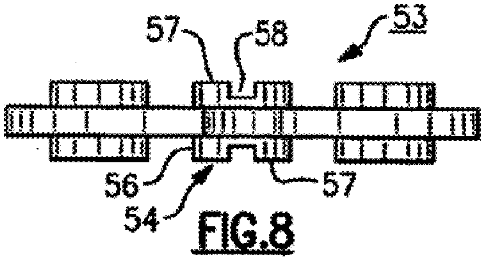
Figure 9:
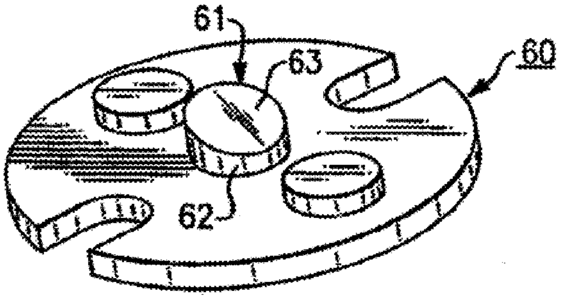
Figure 10:
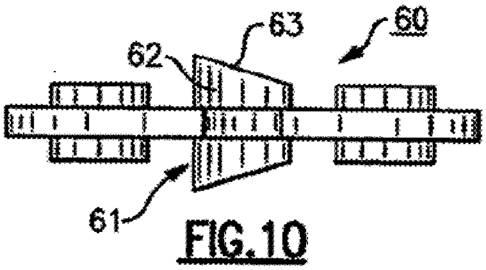
Figure 11:
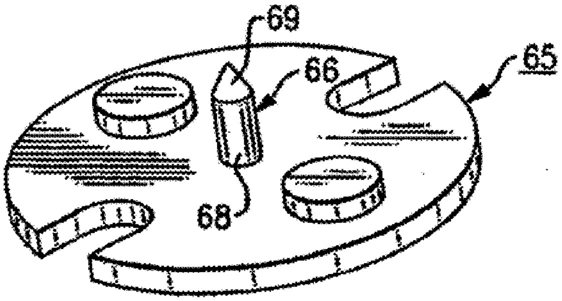
Figure 12:
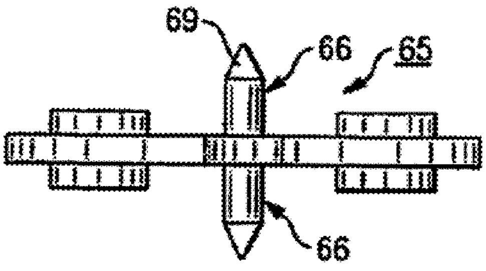
Figure 5:
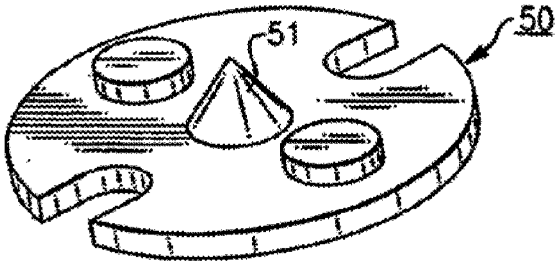
Figure 6:
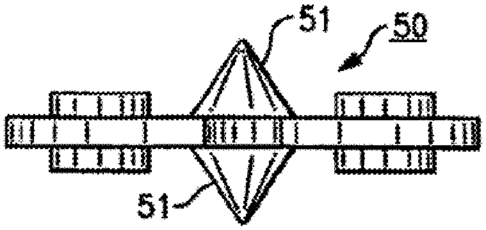
Figure 7:
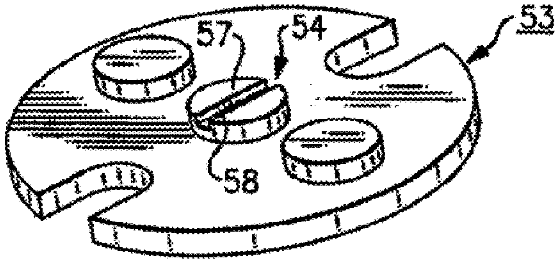
Figure 8:
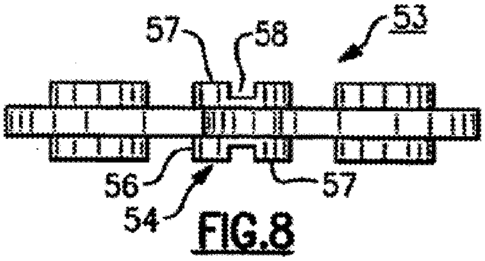
Figure 9:
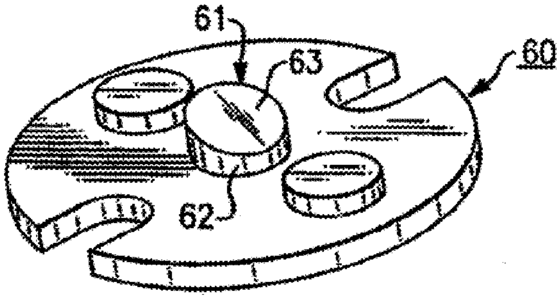
Figure 10:
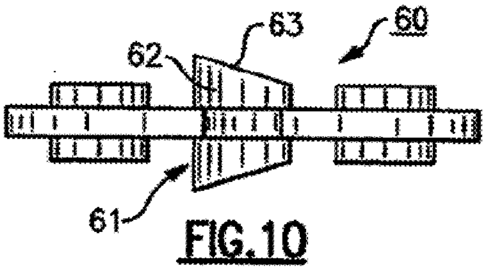
Figure 11:
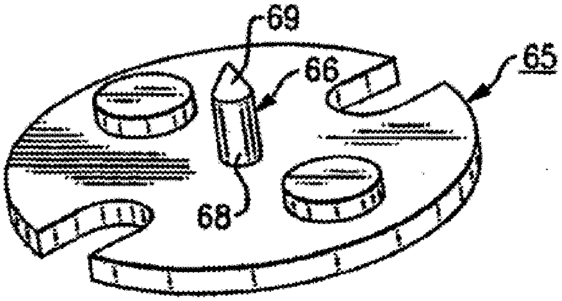
Figure 12:
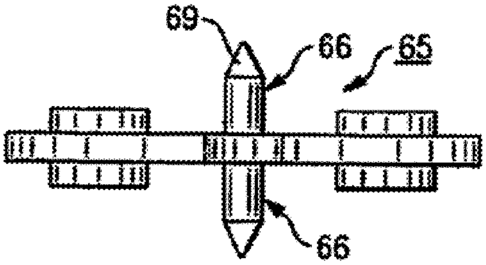

FIGS. 15 and 16 illustrate a shield 80 that contains a harden ball 81 centrally mounted within the shield so that the ball is axially aligned with common axis 15 of the filter. Here again, a tool that is moving along the axis in either direction will be intercepted by the ball and directed away from the axis to induce breakage of the tool.

Although a number of different barrier configuration have been disclosed herein, these disclosures are not exhaustive and any type of barrier that can resist penetration by a cutting tool such as a drill bit and direct the tool away from the central axis of the filter to induce tool breakage can be employed in the practice of the present invention.

While the present invention has been particularly shown and described with reference to the preferred mode as illustrated in the drawing, it will be understood by one skilled in the art that various changes in detail may be effected therein without departing from the spirit and scope of the invention as defined by the claims.

We claim:

1. A tamper-resistant electrical signal filter comprising:

first and second filter housings that are coaxially aligned end to end along a common axis;

said first housing containing a first connector having an opening that is aligned along said common axis for receiving a cable therein carrying a network provider's available signals;

said second housing containing a second connector having an opening that is aligned along said common axis for receiving a subscriber's cable therein;

each of said housings containing at least one filter for blocking or attenuating signals at a selected frequency;

an electrical isolation shield having opposed end faces that are aligned perpendicular to said common axis; and a barrier mounted upon said shield for intercepting a cutting tool that is passed into one of the connector openings and preventing said tool from reaching said other connector opening.

2. The apparatus of claim 1 wherein said barrier is mounted upon each end face of said shield.

3. The apparatus of claim 2 wherein said barrier has an intercept surface that is fabricated of a hardened material for directing said tool away from said common axis.

4. The apparatus of claim 3 wherein said barrier is a cone shaped member having its apex lying on said common axis whereby said tool intercepted by the member is directed away from said common axis.

5. The apparatus of claim 3 wherein said barrier includes a flat inclined surface that passes through the common axis for directing said tool away from said common axis.

6. The apparatus of claim 3 wherein said barrier is a rod that is axially aligned along said common axis and which terminates with said pointed tip whereby a tool that is intercepted by said rod is directed away from said common axis.

7. The apparatus of claim 3 wherein said barrier is a flat topped member having a channel formed in the top surface of the member which passes through said common axis, said channel being arranged to engage said cutting tool moving along said common axis and directing the tool away from said common axis.

8. The apparatus of claim 3 wherein said barrier includes a convex shaped top surface that passes through said common axis whereby said cutting tool that is intercepted by said convex surface is directed away from said common axis.

9. The apparatus of claim 1 wherein said barrier includes a hardened disc centered upon said common axis said disc being rotatably supported in said shield for turning about said common axis.

10. The apparatus of claim 9 wherein said disc mounted within a ball bearing.

11. The apparatus of claim 1 wherein said shield has a series of keys which mate in keyways formed in each of the two filter housings.

12. The apparatus of claim 1 wherein said shield has an off axis opening passing through the shield whereby an electrical lead can be extended between the housings through said opening.

13. A method of protecting against theft of service from a cable system which contains back to back filter assemblies that share a common axis, the method including the steps of:

placing said shield having parallel end faces between the filter units with the end faces being parallel to said common axis; and mounting a barrier upon at least one of the said end faces for intercepting a cutting tool moving along the common axis and directing the tool away from the common axis.

14. The method of claim 13 that includes the further step of inclining a surface on said barrier at an angle with respect to said common axis so as to induce breakage of said intercepted cutting tool.

15. The method of claim 13 wherein said barrier is a cone and locating the apex of said cone upon said common axis.

16. The method of claim 13 that includes the step of mounting a barrier on either side of said end faces.

17. The method of claim 16 that includes the step of fabricating the shield of an electrical insulating material.

18. The method of claim 17 that includes the further step of providing a inclined barrier with a hardened surface for intercepting said cutting tool.

19. Apparatus for protecting against theft of service from a cable system that contains a filter assembly having a pair of back to back filter housings having end connectors that are axially aligned along a common axis, said apparatus comprising:

a shield having two opposed parallel end faces, said shield being mounted between the filter housings with the parallel surfaces of the shield being perpendicular aligned with respect to the common axis; and a barrier means mounted upon at least one end face of said shield for intercepting a cutting tool that is moved into the filter assembly through one of said end connectors along said common axis and directing said tool away from said axis.

20. The apparatus of claim 19 wherein a further barrier means is mounted upon the opposing end face of said shield for intercepting a cutting tool that is moving along said common axis in the opposite direction.

21. The apparatus of claim 19 wherein said shield is fabricated of an electrical insulating material.

22. The apparatus of claim 19 wherein said shield contains a series of keys mounted upon the opposed end faces that mate with complementary keyways formed in said filter housings.

23. The apparatus of claim 22 wherein said shield has an off axis opening passing therethrough for allowing an electrical lead to pass between the filter housings through said plate.

24. Apparatus for protecting against theft of service from a cable system that includes:

a housing having filter components for blocking or attenuating signals at one or more selected frequencies;

said housing having a pair of end connectors for coupling coaxial cables to the housing, said connectors aligned along a common axis;

a barrier mounted inside said housing between the connectors for intercepting a cutting tool moving along said common axis and directing said tool away from said common axis.

25. The apparatus of claim 24 that further includes a shield having parallel end faces that are perpendicularly aligned with respect to said common axis, said barrier being mounted upon one of said end faces.

26. The apparatus of claim 25 that further includes a second barrier mounted upon the other end face.

27. The apparatus of claim 26 wherein each barrier includes an inclined surface that intersects said common axis for directing the cutting tool away from said common axis.

* * * * *

UNITED STATES PATENT AND TRADEMARK OFFICE

CERTIFICATE OF CORRECTION

PATENT NO. : 7,005,945 B2
APPLICATION NO. : 10/865118
DATED : February 28, 206
INVENTOR(S) : Charles N. Lanz et al.

It is certified that error appears in the above-identified patent and that said Letters Patent is hereby corrected as shown below:

Sheet 3 of 4 should be deleted to appear as per attached sheet.

In Column 3 line 42, “sleeve 15” has been changed to “sleeve 25”

Signed and Sealed this

Twenty-first Day of November, 2006

JON W. DUDAS
*Director of the United States Patent and Trademark Office*

UNITED STATES PATENT AND TRADEMARK OFFICE

CERTIFICATE OF CORRECTION

PATENT NO. : 7,005,945 B2
APPLICATION NO. : 10/865118
DATED : February 28, 2006
INVENTOR(S) : Charles N. Lanz et al.

It is certified that error appears in the above-identified patent and that said Letters Patent is hereby corrected as shown below:

Sheet 3 of 4 should be deleted to appear as per attached sheet.

In Column 3 line 42, “sleeve 15” has been changed to “sleeve 25”

This certificate supersedes Certificate of Correction issued November 21, 2006.

Signed and Sealed this

Second Day of January, 2007

JON W. DUDAS
*Director of the United States Patent and Trademark Office*